United States Patent [19]

Jameson

[11] Patent Number: 4,720,770
[45] Date of Patent: Jan. 19, 1988

[54] CONSTANT IMPEDANCE INTEGRATED CIRCUIT CONNECTOR

[75] Inventor: Tom G. Jameson, Minnetonka, Minn.

[73] Assignee: Honeywell, Inc., Minneapolis, Minn.

[21] Appl. No.: 926,154

[22] Filed: Nov. 3, 1986

[51] Int. Cl.$^4$ .............................................. H05K 7/20
[52] U.S. Cl. .................................. 361/387; 174/35 R; 361/424; 439/609
[58] Field of Search ............... 165/80.3, 80 B, 185; 174/16 HS, 35 R, 51, 75 C; 339/112 R, 17 CF, 143 R, 177 R, 177 E; 357/81; 361/386–388, 413, 424

[56] References Cited

U.S. PATENT DOCUMENTS

| | | | |
|---|---|---|---|
| 2,548,457 | 4/1951 | Wilson | 339/177 R |
| 2,963,577 | 12/1960 | Errichiello et al. | 361/424 |
| 3,264,526 | 8/1966 | Wiggerman | 361/424 |
| 3,406,369 | 10/1968 | Taylor, Jr. | 174/35 R |
| 4,370,515 | 1/1983 | Donaldson | 361/424 |
| 4,374,605 | 2/1983 | Bratt | 339/177 E |
| 4,426,127 | 1/1984 | Kubota | 339/177 R |

FOREIGN PATENT DOCUMENTS

0651509  3/1979  U.S.S.R. ............................. 361/386

*Primary Examiner*—Philip H. Leung
*Assistant Examiner*—Gregory D. Thompson
*Attorney, Agent, or Firm*—Thomas J. Nikolai; Frederick W. Niebuhr; Roger W. Jensen

[57] ABSTRACT

An interconnecting grid is disclosed for joining integrated circuit components. The grid has the form of a honeycomb, and is made up of a plurality of interconnected hexagonal conduits, each conduit surrounding an associated pin extended from the integrated circuit component. Each conduit surrounds its associated pin to protect the pin from mechanical damage and isolate the pin from signals emitted by neighboring pins and other extraneous noise. The grid further functions as a heat sink for the removal of heat from the integrated circuit component.

20 Claims, 9 Drawing Figures

CONSTANT IMPEDANCE INTEGRATED CIRCUIT CONNECTOR

BACKGROUND OF THE INVENTION

This invention relates to apparatus for interconnecting integrated circuit components, and for connecting integrated circuits with outside circuitry.

Integrated circuit components are being designed and fabricated in continually smaller sizes, and with increased numbers of electrical leads or contacts provided for each component. Increasingly, such components are required to handle signals of high frequency, including those in the gigahertz range, and with waveforms having extremely rapid rise times measured in picoseconds. To some extent, the size of contacts can be reduced along with the size of the IC chip, chip carrier, or other package. Contacts designed using this approach can be unduly fragile and contact size relative to package size must necessarily increase.

One result of the increased contact density is the need for more efficient removal of heat generated by transmission of signals in and through the IC component. An approach to this problem is disclosed in U.S. Pat. No. 4,546,405 to Haltmark et al granted Oct. 8, 1985, in which a honeycomb-shaped cooling fin structure 26 is mounted on a series of thermally conductive pins 20 extended from a semiconductor package. Mounted on the opposite side of the package are I/O pins 16 for conducting signals into and out of the package.

U.S. Pat. No. 4,539,621 to Currier granted Sept. 3, 1985 shows an integrated circuit carrier for protecting pins 30 by mounting them in recessed fashion in carrier channels of an insulative carrier member 13.

A challenge increasingly faced as IC packages become smaller and have more densely arranged contacts for handling signals with more rapied waveforms, is the need to carefully control the impedance at individual contacts. U.S. Pat. No. 4,218,578 to O'Schusky et al granted Aug. 19, 1980, shows an enclosure surrounding an electronic component to provide RF shielding for the component. Such an approach is less than satisfactory for reduced sized, densely packed IC packages, in which cross-talk between neighboring contacts is a significant problem.

Therefore, it is an object of the present invention to provide a device for connecting integrated circuit components and for maintaining a constant, controlled impedance at the individual contacts of the components.

Another object of the invention is to provide a device which assists in connecting integrated circuit components with outside circuitry while protecting individual contacts against damage.

A further object of the invention is to provide a means for removing heat generated by transmission of signals in and through an IC component.

Yet another object of the invention is to shield individual contacts of an IC component from signals generated at adjacent contacts of the component.

SUMMARY OF THE INVENTION

To achieve these and other objects, there is provided an IC device including a dielectric body and a metallized layer including an integrated circuit mounted over the dielectric body. A plurality of electrically conductive elongate contacts are mounted with respect to the dielectric body. The contacts are in electrical communication with the integrated circuit, and extend away from the dielectric body in a first direction. A plurality of electrically conductive conduit members are mounted with respect to the dielectric body and extend in the first direction. Each of the conduit members is positioned in spaced apart and surrounding relation to an associated one of the elongate contacts. The conduit members are interconnected to form a unitary grid in which the conduit members form a pattern corresponding to the pattern formed by the elongate contacts.

Preferably the elongate connectors are pins mounted on the dielectric body and protruding outward from it. The conduit members can be hexagonal, thus forming a grid having the shape of a honeycomb, with the pins arranged in parallel rows, with the pins in each row offset from the pins in next adjacent rows.

The transverse spacing between each pin and its associatsed conduit member can be selected to determine and maintain the impedance at the particular pin. The device is formed by mounting the grid to a surface of the dielectric body using a thermally conductive epoxy adhesive, or by a technique like soldering or brazing the grid to a metallized surface of the dielectric body. Each of the conduit members is positioned with respect to its associated pin as the grid is attached.

Another aspect of the present invention is an integrated circuit device, including an integrated circuit chip having a substantially flat top surface and a substantially flat bottom surface. A plurality of elongate, conductive first contacts are mounted to the IC chip and extend away from the bottom surface in a first direction. A plurality of elongate, conductive second contacts are mounted to the IC chip and extend away from the bottom surface in a second direction. The device further includes a first unitary grid comprising a plurality of conductive first conduit members mounted to the intergrated circuit chip and extended away from the bottom surface in the first direction. Each of the first conduit members surrounds an associated one of the first contacts, and is spaced apart from the associated first contact a predetermined distance to determine a selected characteristic impedance in the associated first contact. The device includes a second unitary grid comprising a plurality of conductive second conduit members mounted to the integrated circuit chip and extended away from the top surface in the second direction. Each of the second conduit members surrounds an associated one of the second contacts, and is spaced apart from the associated second contact a predetermined distance to determine a selected characteristic impedance in the associated second contact.

Connecting apparatus in accordance with the present invention effectively protects individual contacts, whether they are metallic pins or optical conductors, as each is surrounded by its associated conduit member and can be recessed within the conduit member. The conduit member grid further provides a mechanically stable, constant impedance connection, with the impedance level determined by the pin size and spacing between the pin and its associated conduit member. Because the impedance is controlled, the connections can be used in connection with signals having frequencies in the gigahertz range, and with extremely rapid rise times. An additional benefit is that testing is simplified, due to the improved correlation between test conditions and actual use conditions.

Finally, the grid can be comprised of a thermally conductive material to provide a heat sink for the connecting apparatus. Heat conduction is further enhanced if the grid is attached to the IC component body using a thermally conductive epoxy adhesive.

BRIEF DESCRIPTION OF THE DRAWINGS

For a better understanding of the above and other features and advantages, reference is made to the drawings in which.

DETAILED DESCRIPTION OF THE PREFERRED EMBODIMENT

Figure 1:
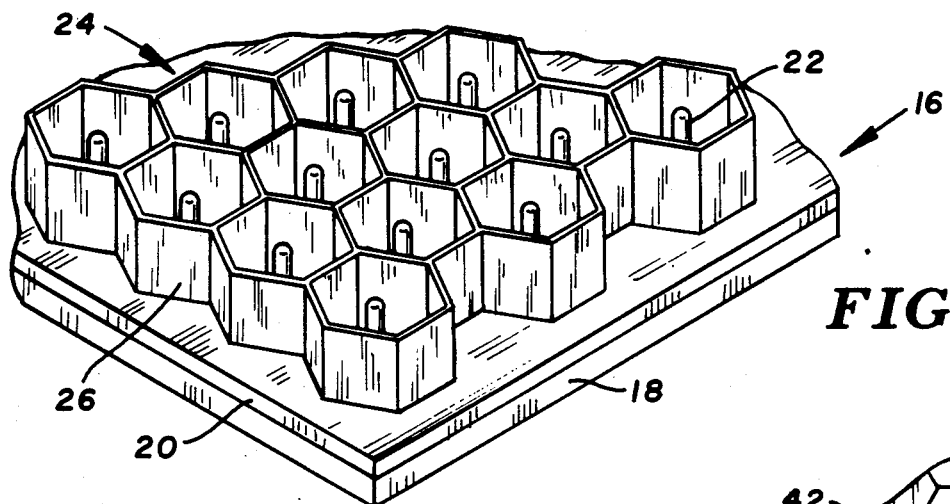
FIG. 1 is a partial perspective view of an integrated circuit component, with a connecting apparatus in accordance with the present invention attached to the component's top surface.

Turning to the drawings, there is shown in FIG. 1 an integrated circuit component, namely an integrated circuit chip 16. For purposes of defining the present invention, it is noted that the component could be a ceramic chip carrier, plastic socket, or other integrated circuit component in lieu of a chip. Chip 16 is generally flat and rectangular, and includes a dielectric substrate layer 18, and a metallized layer 20 formed over the substrate. An integrated circuit is formed in metallized layer 20, using an E-beam process, chemical etching, optical lithography or other known technique. The integrated circuit may be formed in a multiplicity of layers. However, as specific circuit forming techniques are known and not directly germane to the invention, they are not further described.

A plurality of signal pins 22 are embedded in chip 16 and extend vertically upward and away from the chip. Pins 22 are electrically conductive and in electrical communication with the integrated circuit. An electrically conductive grid 24, attached to chip 16, is comprised of a series of interconnected cells or conduits 26, each conduit in spaced apart and surrounding relation to one of pins 22, and electrically isolated from the pin. Grid 24 preferably is formed of brass or beryllium copper (BeCu), and is gold plated.

Figure 2:
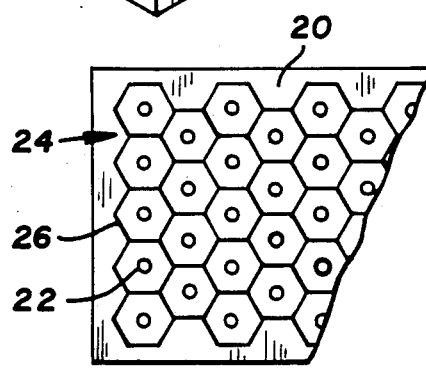
FIG. 2 is a top plan view of the integrated circuit component in FIG. 1.

From FIG. 2 it is apparent that pins 22 are arranged over substantially the entire upper surface of chip 16, and form a pattern of horizontal, staggered rows and vertical, staggered columns. This permits use of a grid in the form of a honeycomb in which conduits or cells 26 are hexagonal, each conduit sharing from two to six of its discrete wall segments with neighboring conduits. The honeycomb configuration of grid 24 corresponds to the pattern of pins 22, so that a properly aligned attachment of the grid to chip 16 substantially centers each of pins 22 within its associated conduit. While the pins and associated conduits are shown to cover the entire upper surface of chip 16, alternative arrangements are suitable, for example a collection of columns along one side of a chip, or a frame of conduits surrounding a central region of the chip.

It should be understood in connection with FIGS. 1 and 2 that grid 24 is attached to the top surface of chip 16 for convenience in illustration. Other orientations are suitable. In fact, signal pins 22 and grid 24 typically extend from the bottom of their associated integrated circuit device.

Figure 3:
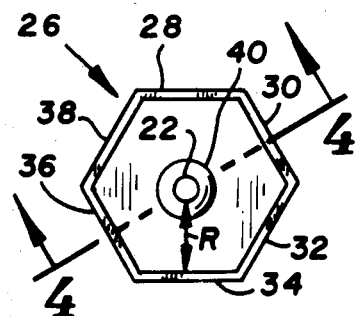
FIG. 3 is a top plan view of a single conduit of the apparatus shown in FIGS. 1 and 2.
Figure 4:
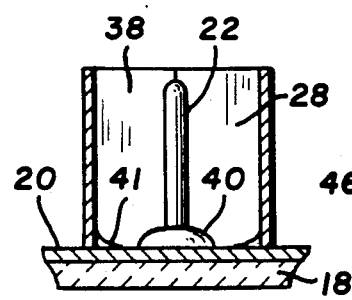
FIG. 4 is a sectional view taken along the line 4—4 in FIG. 3.

FIGS. 3 and 4 illustrate in greater detail one of conduits 26 and its associated signal pin. Each conduit is hexagonal in shape and has six discrete upright wall segments, 28–38. Each signal pin 22 is centered within its associated conduit 26, is embedded in substrate layer 18, and is further stabilized by a pedestal 40 at the base of the pin. Solder 41, a thermally conductive epoxy, or a connection formed by brazing or other suitable method, binds the upright wall segments to metallized layer 20. While metallized layer 20 in FIGS. 1 and 4 is shown as a continuous layer for convenience in illustration, pin 22 and pedestal 40 in fact are separated from the base of each upright wall segment by dielectric material, to electrically isolate the pin from its associated conduit 26.

At least some of the upright wall sections of each conduit are shared with adjacent conduits. In fact, conduits located internally of grid 24 share all of their discrete wall segments with adjoining conduits. Consequently, the conduits support each other to lend mechanical stability to the entire grid, at the same time minimizing material use and cost. Nonetheless, functionally grid 24 is comprised of a multiplicity of individual, hexagonal conduits or cells. As each signal pin 22 is recessed within its associated conduit 26, the pin is protected against mechanical damage. Further, grid 24 is preferably highly thermally conductive, and when attached to chip 16 with solder or a thermally conductive epoxy, effectively dissipates heat generated within chip 16.

A significant aspect of the present invention resides in the fact that each conduit surrounds its associated signal pin to shield the pin from signals emitted by neighboring pins. Cross-talk between adjacent pins is a problem not only due to their close proximity, but also due to the increased use of high frequency signals (100 megahertz and above) in integrated circuit components. At such frequencies, a signal pin or random wire outside of the chip tends to behave as an antenna. Cross-talk among wires, outside noise, and signal reflections all affect the characteristic impedance at a particular signal pin.

Wall segments 28–38 of each conduit form a shield surrounding their associated signal pin 22, thus to maintain a constant impedance at each pin, unaffected by nearby signals and noise. A further feature of the present invention resides in the fact that the impedance at each pin 22 may be maintained at a desired value. More particularly, the impedance may be increased either by reducing the pin diameter, or by increasing the spacing between the pin and its associated conduit, as represented by the distance R in FIG. 3.

Figure 6:
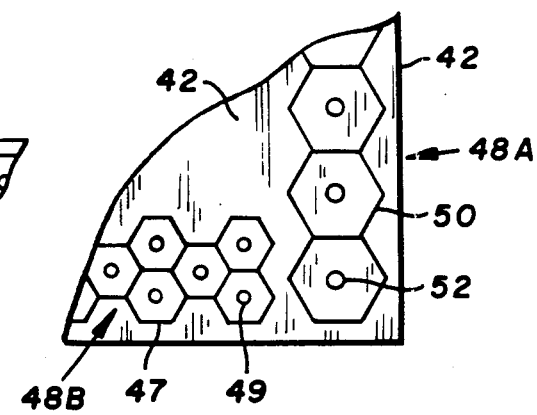
FIG. 6 is a top plan view of the integrated circuit component and connecting apparatus of FIG. 5.
Figure 5:
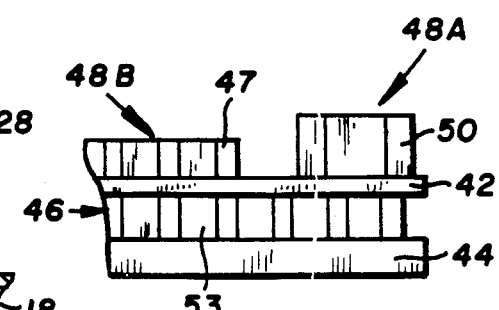
FIG. 5 is a partial side elevation of an alternative integrated circuit component and connecting apparatus constructed in accordance with the present invention.

FIGS. 5 and 6 illustrate an integrated circuit chip 42 connected to (i.e. plugged into) a circuit board 44 by means of a lower grid 46 mounted to the bottom surface of chip 42 and substantially identical to grid 24. Attached to the top surface of chip 42 is an upper grid pattern including a power and ground grid 48A and a test point grid 48B. Grid 48A includes a plurality of hexagonal upper conduits 50, each of which encloses an associated pin 52, which can be either a power or ground pin. Typically, individual conduits 53 of lower grid 46 are from 1/10" to ¼" in diameter, depending on the desired impedance, with conduits 50 typically being substantially larger, again to correspond with a specified impedance. Likewise, power and ground pins 52 are larger than the signal pins contained in conduits 53, since the power and ground pins carry a higher current than the signal pins. Thus, the arrangement in FIG. 5 provides for convenient separation of the signal pins, and the power and ground pins.

Each conduit 47 of grid 48B surround a test point or pin 49. Pins 49 and conduits 47 are likewise given a size corresponding to the desired current handling capability and impedance. Thus, while conduits 47 are illustrated as substantially the same size as conduits 53, the test point conduits may be either larger or smaller than the signal pin conduits. Three staggered rows of test pins 49 are illustrated.

However, the pattern may be altered to meet specific needs. The prime consideration is to enable testing of integrated circuit chip 42 while it is installed on circuit board 44. This in situ testing significantly enhances the correlation between the testing environment and the environment of actual use, and simplifies both the procedure and the type of equipment required for automatic testing.

Figure 7:
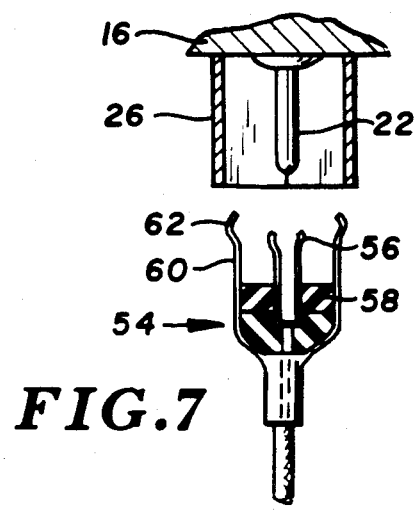
FIG. 7 is a side elevation illustrating a connection of the conduit shown in FIGS. 3 and 4 with a flexible cable connector.

FIG. 7 illustrates the manner in which one of conduits 26 and its associated signal pin 22 are connected to a flexible, coaxial cable 54. For connecting the cable to one of the signal pins, a plurality of elongate, flexible internal prongs 56, two of which are shown, are supported in a dielectric connector base 58. A socket sized to mate with signal pin 22 can be used in lieu of prongs 56. The cable connector further includes a plurality of radially outward elongate and flexible connector prongs 60, of which there are at least two and preferably four. Each prong 60 has a radially inwardly turned end 62, which engages an associated upright wall segment, resulting in an inward bending of prongs 60 as the cable connector is inserted into conduit 26.

Figure 8:
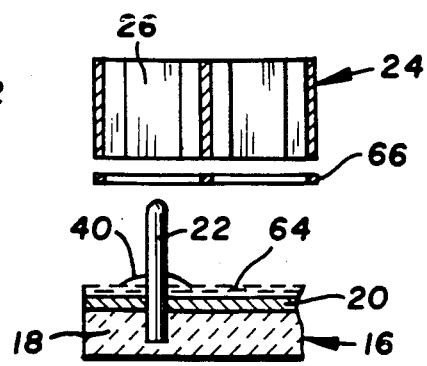
FIG. 8 is a side elevation illustrating the assembly of the connecting apparatus on an IC component.

The connection of grid 24 to chip 16 to form the connector apparatus is best understood from FIG. 8. First, with signal pins 22 in place on the chip, a coating of flux 64 is provided over metallized layer 20. Next, a solder pre-form 66, having the honeycomb configuration of grid 24, is placed on the chip over the flux, and so aligned with chip 16 that each of signal pins 22 is substantially centered within one of the hexagonal compartments of the pre-form. Grid 24 then is placed on pre-form 66 in alignment with the pre-form and signal pins. Finally, with the grid and chip clamped firmly together, the assembly is heated a sufficient amount to allow re-flow of solder pre-form 66. In an alternative construction, a thermally conductive adhesive is used in lieu of solder pre-form 66, in which case the step of providing the flux coating is eliminated. Other connection methods could be used. Further, it should be noted that in the above described components, optical fibers can be employed as the signal conductors in lieu of pins 22.

Figure 9:
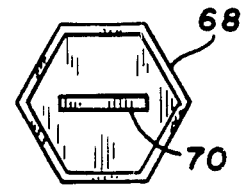
FIG. 9 is a top plan view showing an alternative connecting apparatus conduit structure.

FIG. 9 shows a single conduit 68 of a connecting grid, and an associated flat strap contact 70. The use of strap contacts 70 in lieu of pins is a particular advantage in connection with high frequency signals. To determine and control the impedance at strap 70, it is preferred that the strap be positioned such that a plane including the center of the strap, in the direction of the strap width, passes through opposed corners of conduit 68.

The connecting apparatus described is particularly well suited for small integrated circuit components having multiple contacts and handling high frequency signals with extremely short rise times. Each conduit surrounds its associated pin to shield the pin from signals emitted by adjacent signal pins and from any other extraneous noise. By its size in relation to the pin as well as the pin size, the conduit determines and maintains a constant impedance at the signal pin. Each conduit further protects its associated pin from physical damage, particularly when the signal pin is recessed within the conduit. In their grid-forming combination, the conduits cooperate to support one another and further protect the associated signal pins, and provide an effective means for removing heat from the IC component. Also, the connecting apparatus is conveniently assembled, due to the fact that alignment of the grid against the IC component effects the simultaneous alignment of all individual conduits and associated signal pins.

What is claimed is:
1. An integrated circuit device comprising:
   a dielectric body, and a metallized layer including an integrated circuit mounted over the dielectric body;
   a plurality of electrically conductive elongate contacts mounted with respect to the dielectric body, in electrical communication with said integrated circuit, and extending away from said dielectric body in a first direction; and
   a plurality of electrically conductive conduit members mounted with respect to said dielectric body and extending in said first direction, each of said conduit members positioned in spaced apart and surrounding relation to an associated one of said elongate contacts;
   said conduit members being interconnected to form a unitary grid in which said conduit members form a pattern corresponding to the pattern formed by said elongated contacts.
2. The integrated circuit device of claim 1 wherein:
   said elongated connectors comprise pins embedded in said dielectric body and protruding outward from the dielectric body in said first direction.
3. The integrated circuit device of claim 2 wherein:
   each of said conduit members includes a plurality of discrete wall segments, and at least one of the wall segments of each conduit member is shared with an adjacent conduit member.
4. The integrated circuit device of claim 3 wherein:
   said conduit members are hexagonal and form a grid having the shape of a honeycomb, and said pins are arranged in parallel longitudinal rows, with the pins in each row longitudinally offset from the pins in next adjacent rows.
5. The integrated circuit device of claim 1 wherein:
   the spacing between each of said contacts and its associated conduit member is selected to maintain a predetermined impedance at each of said contacts.
6. The integrated circuit device of claim 5 wherein:
   each of said contacts comprises a pin circular in cross-section and centered within its associated conduit member.
7. The integrated circuit device of claim 1 wherein:

each of said elongate contacts is flat and rectangular in cross-section with a cross-sectional width greater than its cross-sectional thickness, each of said conduit members is hexagonal, and wherein each of said contacts is positioned in its associated conduit member such that a plane including two opposite corners of said conduit member passes through said associated contact in the direction of the width of said contact.

8. The integrated circuit device of claim 1 wherein: said grid is mounted with respect to said dielectric body by a thermally conductive epoxy adhesive.

9. The integrated circuit device of claim 1 wherein: said grid is soldered to said metallized layer.

10. The integrated circuit device of claim 1 wherein: said dielectric body is substantially flat and rectangular, with said elongate contacts embedded in said dielectric body and extending from opposite sides of said body, and wherein first contact portions of said contacts are extended from one side of said body, and surrounded by first ones of said conduit members mounted on said one side and second contact portions of said contacts, larger in cross-section than said first contact portions, are extended from the opposite side of said body, said second contacts surrounded by correspondingly larger second ones of said conduit members mounted to said opposite side of the body.

11. The integrated circuit device of claim 1 in combination with apparatus including:
an elongate connector means mounted to a dielectirc base, extended therefrom and adapted for electrical and mechanical engagement with an associated one of said contacts; and
a plurality of elastically deformable connector members mounted to said dielectric base and extending therefrom generally parallel to said connector means and in spaced apart relation to said connector means, and adapted for insertion into an associated one of said conduit members, elastically deforming upon said insertion to guide said connector means into said electrical and mechanical engagement with said associated contact and to frictionally maintain said engagement.

12. The integrated circuit device of claim 11 wherein: each of said conduit members includes a plurality of discrete wall segments, with each of said connector members adapted to engage one of said segments upon said insertion.

13. The integrated circuit device of claim 12 wherein: said conduit members are hexagonal and form a grid having the shape of a honeycomb, and said contacts are arranged in parallel longitudinal rows, with the contacts in each row longitudinally offset from the contacts in adjacent rows.

14. The integrated circuit device of claim 11 wherein: said connector members and said connector means comprise electrically conductive prongs.

15. The integrated circuit device of claim 11 wherein: said first contacts comprise pins.

16. The integrated circuit device of claim 15 wherein: each of said connector means comprises a plurality of associated spring loaded prongs adapted to frictionally engage their associated pin.

17. The integrated circuit device of claim 11 wherein: said plurality of connector members comprise at least four of said connector members associated with each of said connector means.

18. An integrated circuit device including:
an integrated circuit chip having a substantially flat top surface and a substantially flat bottom surface;
a plurality of elongate, conductive first contacts mounted to said integrated circuit chip and extended away from said bottom surface in a first direction; and a plurality of elongate, conductive second contacts mounted to said integrated circuit chip and extended away from said top surface in a second direction;
a first unitary grid comprising a plurality of conductive first conduit members mounted to said integrated circuit chip and extended away from said bottom surface in said first direction, each of said first conduit members surrounding an associated one of said first contacts and spaced apart from said associated contact a predetermined distance to determine a selected characteristic impedance in said associated first contact; and
a second unitary grid comprising a plurality of conductive second conduit members mounted to said integrated circuit chip and extended away from said top surface in said second direction, each of said second conduit members surrounding an associated one of said second contacts and spaced apart from said associated second contact a predetermined distance to determine a selected characteristic impedance in said associated second contact.

19. The integrated circuit device of claim 18 wherein: said first contacts comprise signal pins, and said second contacts comprise test pins.

20. The integrated circuit device of claim 19 further including:
a plurality of elongate, conductive third contacts mounted to said integrated circuit chip and extended away from said top surface in said second direction, said third contacts being larger than said first contacts and said second contacts; and
a third unitary grid comprising a plurality of conductive third conduit members mounted to said integrated circuit chip and extended way from said top surface in said second direction, each of said third conduit members being larger than said first conduit members and said second conduit members, surrounding an associated one of said third contacts, and spaced apart from said associated third contact a predetermined distance to determine a selected characteristic impedance in said associated third contact.

* * * * *